United States Patent [19]
Van Heels-Bergen et al.

[11] Patent Number: 5,587,656
[45] Date of Patent: Dec. 24, 1996

[54] MAGNETIC RESONANCE IMAGING METHOD AND APPARATUS

[75] Inventors: Teunis R. Van Heels-Bergen; Miha Fuderer, both of Eindhoven, Netherlands

[73] Assignee: U.S. Philips Corporation, New York, N.Y.

[21] Appl. No.: 419,491

[22] Filed: Apr. 10, 1995

[30] Foreign Application Priority Data

Apr. 8, 1994 [EP] European Pat. Off. ............. 94200959

[51] Int. Cl.⁶ .................................................. G01V 3/00
[52] U.S. Cl. ............................................. 324/307; 324/309
[58] Field of Search ..................................... 324/307, 309, 324/312, 314, 318, 322

[56] References Cited

U.S. PATENT DOCUMENTS

| | | | |
|---|---|---|---|
| 4,463,375 | 7/1984 | Macovski | 358/111 |
| 4,825,162 | 4/1989 | Roemer et al. | 324/318 |
| 4,827,528 | 5/1989 | Macovski | 382/6 |
| 5,243,288 | 9/1993 | Mori | 324/314 |
| 5,280,246 | 1/1994 | Takahashi et al. | 324/322 |

FOREIGN PATENT DOCUMENTS

| | | |
|---|---|---|
| 0271123 | 6/1988 | European Pat. Off. . |
| 0412824 | 2/1991 | European Pat. Off. . |
| 0472390 | 2/1992 | European Pat. Off. . |

OTHER PUBLICATIONS

"The NMR Phased Array" P. B. Roemer et al, Magnetic Resonance In Medicine, 16 pp. 192–225 (1990).

SMRM 1987, Abstract 266.

SMRM 1991, Abstract 744.

*Primary Examiner*—Louis M. Arana
*Attorney, Agent, or Firm*—Jack D. Slobod

[57] ABSTRACT

A method of determining a magnetic resonance (MR) distribution in a part of a body uses an arrangement of multiple surface coils. According to the method, component distributions are determined using separate ones of the surface coils and the component distributions are combined to form the MR distribution. This is done by first combining the component distributions to form a distribution $I_{hom}$ which is optimized with respect to homogeneity and a distribution $I_{snr}$ which is optimized with respect to signal-to-noise ratio (SNR). Then the distributions $I_{hom}$ and $I_{snr}$ are combined to form the MR distribution, preferably by determining a smoothed ratio of the distributions $I_{hom}$ and $I_{snr}$ and using that ratio to correct $I_{snr}$ for homogeneity. Also an apparatus to perform the method is disclosed.

21 Claims, 4 Drawing Sheets

MAGNETIC RESONANCE IMAGING METHOD AND APPARATUS

BACKGROUND OF THE INVENTION

1. Field of the Invention

The invention relates to a method of determining a magnetic resonance (MR) distribution in a part of a body using an arrangement of multiple surface coils, in which method by means of separate surface coils component distributions are determined and said component distributions are combined to form said NMR distribution.

The invention relates also to a magnetic resonance (MR) imaging apparatus for determining a MR distribution in a part of a body using such method, comprising input terminals for an arrangement of multiple surface coils, means to determine component distributions using separate surface coils of said arrangement and means to combine said component distributions to form a MR distribution.

2. Description of the Related Art

When acquiring MR images with several receiver coils simultaneously, sometimes called the synergy concept, there is the problem to combine the separate results into a homogeneous result image.

Formally one can write that, using N coils, N images or volumes $$s_j(x,y,z) \tag{Eq. 1}$$

are acquired. $j \in \{1, \ldots N\}$ is the coil index and $S_j(x,y,z)$ are complex voxel values at position $(x,y,z)$. The problem is to combine these images into a single image (or volume) $I(x,y,z)$ that is both optimal in signal-to-noise ratio (SNR) and homogeneous, i.e. that the same spin magnetisation density results in the same pixel value in $I(x,y,z)$.

A method pertaining to the field of the present application is known from the European patent application EP 0 472 390 A2. In this patent application is described that it was usual to reconstruct composite images from MR phased arrays in the time domain by combining the individual image contributions on a weighted, point by point basis after first acquiring the complete MR images for each separate coil. The reason for acquiring the separate images first is that that the optimum set of weights needed to maximize SNR when combining the separate signals is a function of position, and so varies from point to point.

In EP 0 472 390 it is suggested to combine the signals in the time domain by convolving them with a time domain representation of a field map of the respective one of the receiver coils. However, such reconstruction requires the exact knowledge of coil sensitivity at each location.

In the article in Magnetic Resonance in Medicine, 16(2), pp. 195–225 (1990) is described the sum-of-squares method, where $I(x,y,z)$ is calculated by:

$$I(x,y,z) = \sqrt{\sum_{j=1}^{N} |S_j(x,y,z)|^2} \tag{Eq. 2}$$

However, this result tends to be very inhomogeneous.

Several solutions for this problem have been proposed, but many of these tend to be relatively impractical and/or limited in the ability to correct for the inhomogeneity.

One possibility is to estimate the sensitivity of the separate coils by low-pass filtering (i.e. "smoothing" or "averaging") of the surface coil image itself. See, as an example: SMRM 1991, abstract 744, or the equivalents thereof for simple surface coils: SMRM 1987, abstract 266, and the article in American Journal of Radiology 147, pp. 379–382 (1986). The effectiveness of these methods is limited, particularly if the actual spin density in the object shows considerable a-symmetries.

It has also been suggested to measure a homogeneous water phantom with the same coil setup and to use the results for calibration. Yet, this method is very impractical.

Another approach would be to measure the same object with an additional, very homogeneous coil, and to use the resulting image to calibrate the intensities of the image obtained with the arrangement of multiple surface coils. In the European patent application EP 0 271 123 A1 such an approach is described for calibration of a single surface coil with the signals obtained by means of a body coil. However, this approach either costs additional scan time (when acquiring the homogeneous image before or after the actual acquisition with the surface coil(s)), or it poses a yet unresolved problem of simultaneous aquisition.

Other background art on synthesizing the separate images of surface coil arrays is disclosed in the European patent application EP 0 412 824 A2 and the U.S. Pat. No. 4,825, 162.

SUMMARY OF THE INVENTION

It is inter alia an object of the invention to provide a method utilizing an arrangement of multiple surface coils in which the resulting image is optimal with respect to both homogeneity and signal-to-noise ratio (SNR). It is also an object of the invention to avoid the scan time which would be necessary for calibrating an arrangement of multiple surface coils, also referred to as a coil array.

In order to accomplish these and other objects of the invention, in a method as described in the preamble of this application said component distributions are combined to form a distribution $I_{hom}$ which is optimal with respect to homogeneity and are combined to form a distribution $I_{SNR}$ which is optimal with respect to signal-to-noise ratio, and said distributions $I_{hom}$ and $I_{SNR}$ are combined to form said MR distribution.

The determination of $I_{hom}$ and $I_{SNR}$ requires only computing time and no additional scan time and the improvement of homogeneity of the noise free image using the information of the homogeneous image appears to be very successful.

In one embodiment of the invention the ratio of $I_{hom}$ and $I_{SNR}$ is determined and used to correct the homogeneity of $I_{SNR}$, the corrected $I_{SNR}$ forming said MR distribution.

In a preferred embodiment of the invention $I_{hom}$ and $I_{SNR}$ are smoothed and the ratio of said smoothed $I_{hom}$ and said smoothed $I_{SNR}$ is determined and used to correct the homogeneity of $I_{SNR}$, the corrected $I_{SNR}$ forming said MR distribution.

In another embodiment of the invention the ratio of $I_{hom}$ and $I_{SNR}$ is determined, said ratio is smoothed and said smoothed ratio is used to correct the homogeneity of $I_{SNR}$, the corrected $I_{SNR}$ forming said MR distribution.

There are several possibilities to determine $I_{hom}$ and $I_{SNR}$.

One way to determine $I_{SNR}$ is to determine the square root of the sum of the squares of the absolute values of said component distributions.

In one way to determine $I_{hom}$, $I_{hom}$ equals the $\alpha$ root of the sum of the $\alpha$ powers of the absolute values of said component distributions with $\alpha \leq 1.5$. Of course $\alpha = 1$ means simple addition of the absolute values, but it turns out that $\alpha=0.5$ gives a still more homogeneous image.

Another way to determine $I_{hom}$ is to determine the absolute value of the sum of the complex values of said component distributions.

Still another way of determining said combination of said component distributions to form $I_{hom}$ includes multiplication of each component distribution with a weight factor.

A magnetic resonance (MR) imaging apparatus for determining a NMR distribution in a part of a body and using a method as described above, comprises input terminals for an arrangement of multiple surface coils, means to determine component distributions using separate surface coils of said arrangement and means to combine said component distributions to form a MR distribution, and comprises according to the invention means to combine said component distributions to form a distribution $I_{hom}$ which is optimal with respect to homogeneity, by means to combine said component distributions to form a distribution $I_{SNR}$ which is optimal with respect to signal-to-noise ratio and by means to combine said distributions $I_{hom}$ and $I_{SNR}$ to form said MR distribution.

BRIEF DESCRIPTION OF THE DRAWING

These and other aspects of the invention are further explained with reference to the accompanying drawing of which.

DESCRIPTION OF PREFERRED EMBODIMENTS

Where in the preceding or following description or in the claims the expression "image" or MR "distribution" is used, not only a visual image is meant such as it may be observed on a monitor, but also an electronic image in digital form, being processed in processing means or stored in memory means. An image or distribution may be in two dimensions (x,y) or in three dimensions (x,y,z). A digital image consists of picture elements which are usually called pixels or, in the three-dimensional case, voxels.

As is also customary in the art of magnetic resonance imaging, the signals are sampled and digitized and the further image processing is digital. All that is implicit in this description.

Where in the description reference is made to magnetic resonance, this implies nuclear spin resonance which in a specific situation is proton spin resonance and it also implies electron spin resonance.

Magnetic resonance imaging is very useful in medical applications, that needs no further explanation. The object to be imaged is then a patient or generally a human being to be examined.

Figure 1:
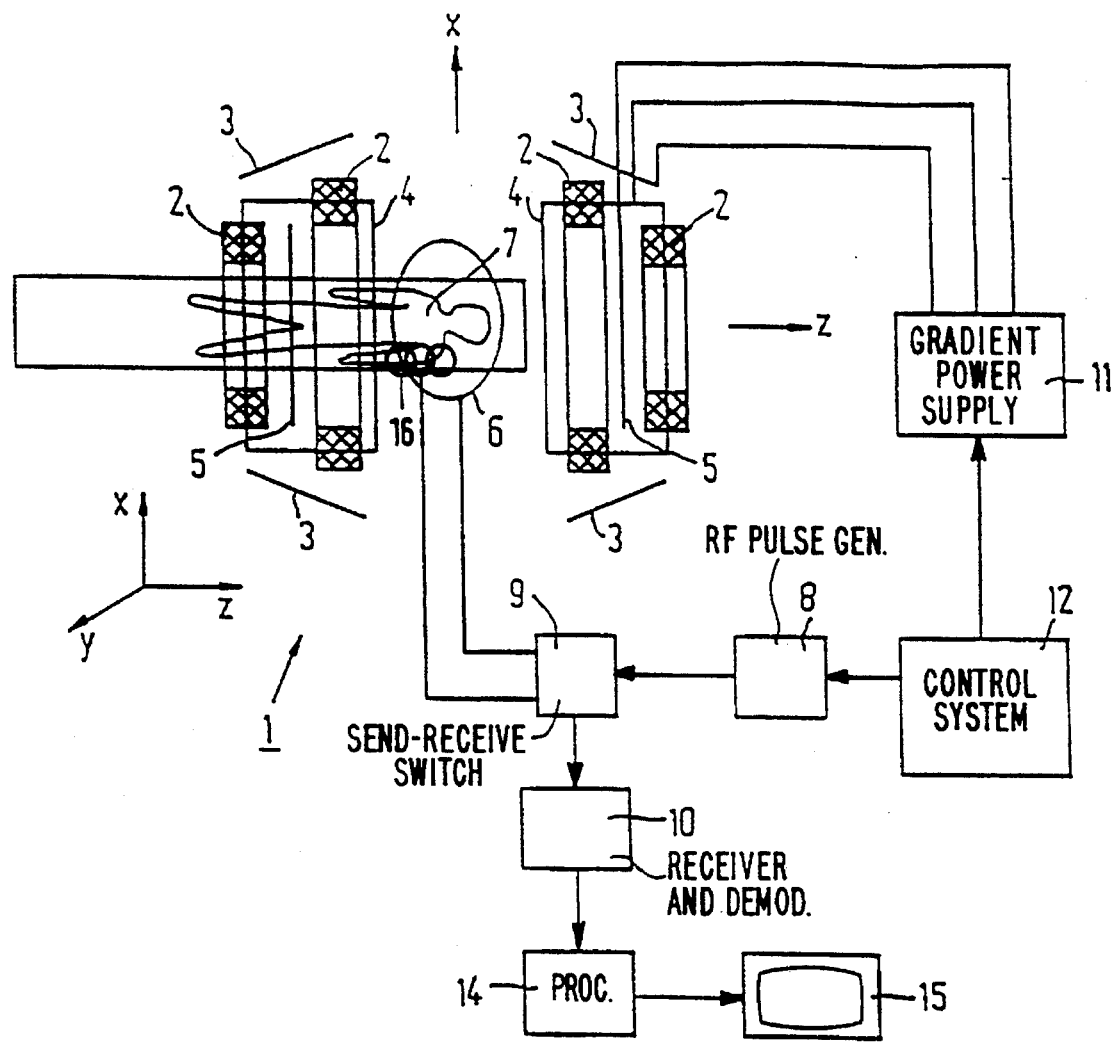
FIG. 1 shows a block diagram of an apparatus for performing a method according to the invention.

In FIG. 1 a magnetic resonance apparatus 1 is diagrammatically shown. The apparatus comprises a set of main magnetic coils 2 for generating a stationary homogeneous main magnetic field and several sets of gradient coils 3, 4 and 5 for superimposing on the main magnetic field additional gradient magnetic fields each having a controlled gradient in a different direction. Conventionally, the direction of the main magnetic field is labelled the z direction, the two directions perpendicular thereto are the x and y directions. The gradient coils are energized via a power supply 11. The apparatus further comprises excitation means 6 in the form of a so-called body coil for emitting radio-frequency pulses (RF-pulses) to an object or body 7, the excitation means 6 being coupled to an RF-pulse generator 8 for generating and modulating the RF-pulses.

Also provided are means for receiving the MR-signals, these means can be identical to the excitation means 6 or be separate, as with the present invention, in the form of an array of surface coils 16. A body coil is a coil surrounding a (part of a) body and has generally a very homogeneous sensitivity distribution, whereas a surface coil is a coil used close to one side of a (part of a) body. A surface coil has generally a limited field of view, a high sensitivity but an inhomogeneous sensitivity distribution. A send-receive switch 9 is arranged to separate the received signals from the excitation pulses. The received magnetic resonance signals are input to receiver and demodulator 10. The excitation means 6 and RF-pulse generator 8 and the power supply 11 for the gradient coils 3, 4 and 5 are steered by a control system 12 to generate a predetermined sequence of RF-pulses and gradient field pulses. The receiver and demodulator 10 is coupled to data processor 14, for example a computer, for transformation of the received signals into an image that can be made visible, for example on a visual display unit 15.

If the magnetic resonance apparatus 1 is put into operation with an object or body 7 placed in the magnetic field, a small excess of magnetic dipole moments (nuclear or electron spins) in the body will be aligned in the direction of the magnetic field. In equilibrium, this causes a net magnetization $M_0$ in the material of the body 7, directed in parallel with the magnetic field. In the apparatus 1 the macroscopic magnetization $M_0$ is manipulated by radiating to the body RF-pulses having a frequency equal to the Larmor frequency of the dipole moments, thereby bringing the dipole moments in an exited state and re-orienting the magnetization $M_0$. By applying the proper RF-pulses, a rotation of the macroscopic magnetization is obtained, the angle of rotation is called the flip-angle. The introduction of variations in the magnetic field by applying gradient magnetic fields influences the behavior of the magnetisation locally. After the application of RF-pulses, the changed magnetization will tend to return to a state of thermal equilibrium in the magnetic field, emitting radiation in the process. A well chosen sequence of RF-pulses and gradient field pulses causes this radiation to be emitted as (decaying) magnetic resonance signals which provide spatial information about the density and/or relaxation times of a certain type of nuclei, for example hydrogen nuclei, and the substance in which they occur. By analysis of the emitted signals, picked up by the coil 6 or—with the present invention with the surface coil array 16—and by presentation of it in the form of images, information about the internal structure of the object or body 7 is accessible. The decaying magnetic resonance signal directly after the excitation is called a FID (Free Induction Decay). By proper application of the gradients and/or application of additional excitation (RF) pulses also an echo of the FID may be produced and used to derive image information.

For a more detailed description of magnetic resonance imaging (MRI) and MRI-devices reference is made to the extensive literature on this subject, for example to the book "Practical NMR Imaging", edited by M. A. Foster and J. M. S. Hutchinson, 1987, IRL Press.

Figure 2:
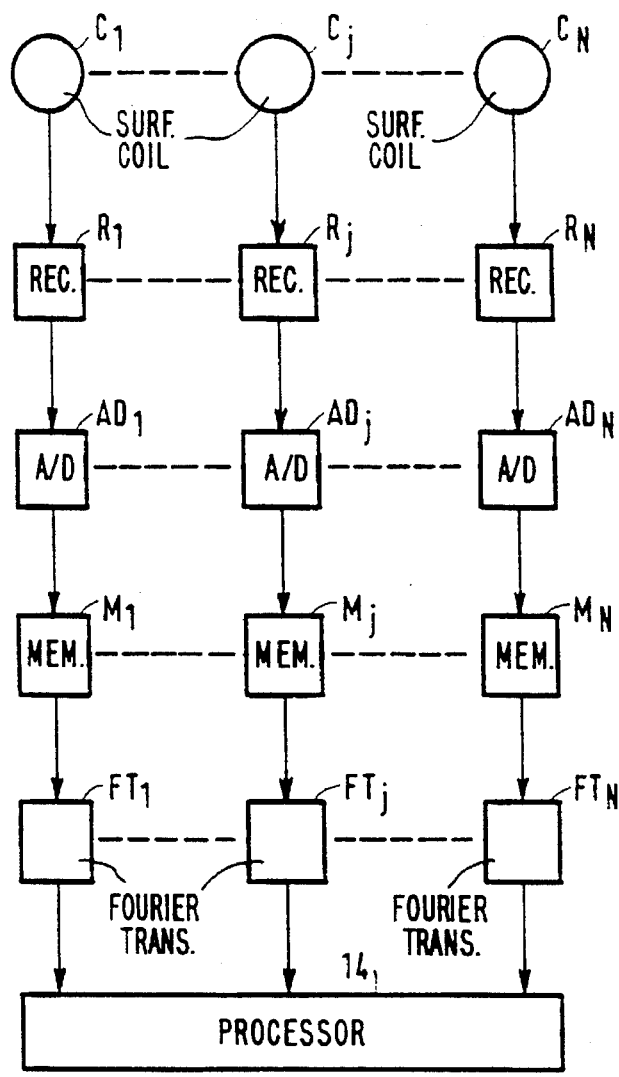
FIG. 2 shows a block diagram of a detail of such apparatus.

In FIG. 2 the receiver and demodulator means for the array of surface coils 16 is diagrammatically shown. Surface coils $C_1, \ldots, C_j, \ldots C_N$ are connected to receivers $R_1, \ldots R_j, \ldots R_N$, analog to digital converters $AD_1, \ldots, AD_j, \ldots AD_N$, memories $M_1, \ldots, M_j, \ldots M_N$ and Fourier transform computing means $FT_1, \ldots, FT_j, \ldots FT_N$. By means of the fourier transform means, N images (component distributions) $S_j=S_j(x,y,z)$ detected by the N surface coils are determined in a well known way. These N images are processed in processor means 14 to obtain the final image. This processing will be described hereinafter.

In the processor 14, two different combinations of the N images $S_j(x,y,z)$ are made, one that is optimal in (i.e. optimized for) signal-to-noise ratio but suboptimal in homogeneity called $I_{SNR}(x,y,z)$, and one that is optimized for homogeneity but suboptimal in terms of signal-to-noise ratio called $I_{hom}(x,y,z)$. Then a smoothed ratio between $I_{hom}(x,y,z)$ and $I_{SNR}(x,y,z)$ is used to correct the intensity variations of $I_{SNR}(x,y,z)$. Smoothing or averaging can be performed either on $I_{hom}$ and $I_{SNR}$ separately (as in FIG. 3) or on their ratio.

Figure 3:
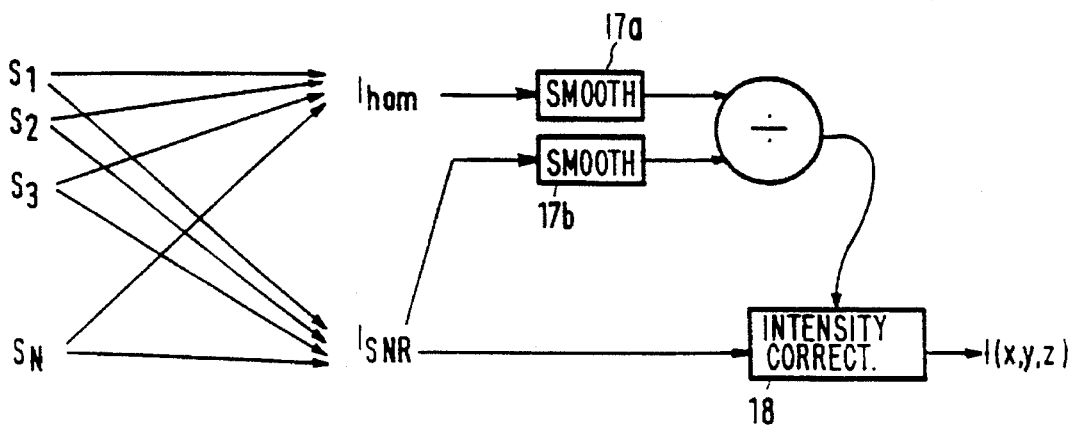
FIG. 3 is a schematic drawing to explain one embodiment of the invention.

FIG. 3 shows schematically this processing. In blocks 17a and 17b smoothing takes place of $I_{hom}$ and $I_{SNR}$ respectively. In block 18 the intensity correction of $I_{SNR}$ takes place resulting in $I(x,y,z)$.

The method described is computationally very efficient (only one additional image combination action, one or two smoothing actions and a few divisions), it does not require complicated handling of pre-stored coil sensitivity patterns and it does not require additional scans.

The algorithm to combine the separate coil component images into one single image that is optimal in SNR has already been mentioned. If there is no detailed knowledge on the coil sensitivity pattern, then the combination which is optimal in terms of signal-to-noise ratio can be written as:

$$I_{SNR}(x,y,z) = \sqrt{\sum_{j=1}^{N} |S_j(x,y,z)|^2} \qquad \text{(Eq. 3)}$$

In theory, this is only valid if the noise correlation is negligible and the noise is constant, or, in other words the noise correlation matrix is purely diagonal and constant. In the article in Magnetic Resonance in Imaging, 16(2), pp. 195–225 (1990) already referred to, this would be denoted as $R_{ij}=\delta_{ij}$, with $\delta$ the Kronecker delta. If the noise correlation is not negligible, then the optimal combination would become:

$$I_{SNR}(x,y,z) = \sqrt{\sum_{j=1}^{N} \sum_{i=1}^{N} S_i(x,y,z)(R^{-1})_{ij} S_j^*(x,y,z)} \qquad \text{(Eq. 4)}$$

This is only mentioned for completeness, since in the majority of practical cases this correlation can be neglected.

The above algorithm is widely used. However, methods that are optimized to obtain a combined image that suffers least from variations in coil sensitivity patterns has obtained significantly less attention. This is, of course, because in magnetic resonance imaging the signal-to-noise ratio is of primary concern. However, it is felt that there is also a great need for an image that is at the same time also homogeneous.

It is known that in most cases the simple addition of the component images results in a image that is more homogeneous than the root(sum(squares)) image, so one could combine $I_{hom}$ as:

$$I_{hom}(x,y,z) = \sum_{j=1}^{N} |S_j(x,y,z)| \qquad \text{(Eq. 5)}$$

Improved versions of this are possible and explained below. Yet, an important aspect of the invention is how to combine $I_{hom}$ and $I_{SNR}$ into an image that combines the best of both worlds.

Such a problem has been hinted at in EP 0 271 123 referred to above. There it is proposed to correct an image of an ordinary MR surface coil (high SNR but inhomogeneous) with the corresponding body coil image (homogeneous but low SNR).

In a preferred embodiment of the invention:

$$I(x,y,z) = I_{SNR}(x,y,z) \frac{\text{SMOOTH}(I_{hom}(x,y,z))}{\text{SMOOTH}(I_{SNR}(x,y,z))} \qquad \text{(Eq. 6)}$$

where SMOOTH is a low-pass filtering operation. Many of such averaging operations are possible but the simplest is the uniform convolution that can be defined as:

$$\text{SMOOTH}(I_{any}(x,y,z)) = \qquad \text{(Eq. 7)}$$

$$(2M+1)^{-d} \sum_{i=-M}^{M} \sum_{j=-M}^{M} \sum_{k=-M}^{M} I_{any}(x-i, y-j, z-k)$$

In Eq. 7, d is the number of dimensions, so 2 or 3. The optimal value of M depends on the details of the method to calculate $I_{hom}$, on the noise level and on d, but in practical situations it will range between 3 and 10.

The mentioned smoothing action prevents that the the noise in the low-SNR image $I_{hom}$ leaks into the final result. This can be explained by the observation that if it is omitted the result becomes equal to $I_{hom}$. So on one hand, the aim of the noise elimination in the intensity correction function SMOOTH determines the minimum required value of M, on the other hand the smoothed functions should not be smoother than the shape of the actual combined coil sensitivity function. This puts a maximum constraint on the useable values of M.

As has been stated, the simple sum of the $|S_j|$ values over j results in a more homogeneous image than the optimal-SNR result. However, this is in no way optimal in terms of resulting homogeneity. More generally can be written:

$$I_{hom}(x,y,z) = \left( \sum_{j=1}^{N} |S_j(x,y,z)|^\alpha \right)^{1/\alpha} \qquad \text{(Eq. 8)}$$

For any value of $\alpha$ this function is still linearly proportional to the actual spin magnetization density. With $\alpha=2$ one gets $I_{SNR}$, which is clearly non-optimal in terms of homogeneity. For $\alpha=1$ (simple addition) the homogeneity is already improved. Practice shows that even lower values of $\alpha$, typically $\alpha=0.5$, give a still more homogeneous image. Heuristically, this can be explained as follows: suppose one has a set of twelve coils wrapped around a human body. In a region that is relatively close to coil 1 but relatively far from all other coils, only the sensitivity of coil 1 exhibits large variations. With high values of $\alpha$, coil 1 would predominate the sum, leading to an inhomogeneous result. With extremely low values of $\alpha$, the combined sensitivity is dominated by the majority of the coils images, rather than the strongest one. And since all coil images except that of coil 1 have a rather flat sensitivity pattern in that area, the result is relatively homogeneous. However, with very low values of $\alpha$, the SNR of the resulting combination becomes prohibitively low. In practice, a value of $\alpha=0.5$ is a good compromise.

The preceding explanation mentions only the modulus $|S_j|$ of the signals. Using the modulus is indeed necessary if it is unknown what the amplifier chain of each component image contributes to the phase of the signal and if this phase contribution varies per component image. But if this phase contribution is sufficiently predictable or controllable, it can be advantageous to combine the complex values of $S_j$ to obtain a better result for $I_{hom}$. Some phase adjustment per component image will be necessary:

$$I_{hom} = \left| \sum_{j=1}^{N} e^{i\phi_j} S_j(x,y,z) \right| \quad \text{(Eq. 9)}$$

A typical case where this is advantageous is the case where the array of surface coils is arranged as a so-called birdcage-resonator. In that case, the phases $\phi_j$ are the same as one would apply electronically in a conventional birdcage-resonator setup. The resulting $I_{hom}$ is known to be very homogeneous.

The advantage of a birdcage-like synenergy coil array over a conventional (electronically added signals) birdcage-resonator, is that the synenergy coil array allows to reconstruct $I_{SNR}$ as well. So using the invention one can obtain an image that is as homogeneous as an image from a birdcage-resonator, but has a much better signal-to-noise ratio in most regions of the object.

It is also possible to make use of electronically added signals as the reference for $I_{hom}$, to save the computational effort of complex addition, at the cost of one array channel to be used to acquire the signal.

Another improvement of the basic idea of the invention is to premultiply the signals of the various component images with a fixed constant. So one gets either:

$$I_{hom}(x,y,z) = \left( \sum_{j=1}^{N} |A_j S_j(x,y,z)|^\alpha \right)^{1/\alpha} \quad \text{(Eq. 10)}$$

i.e. an improved version of Eq. 8, or:

$$I_{hom}(x,y,z) = \left| \sum_{j=1}^{N} A_j e^{i\phi_j} S_j(x,y,z) \right| \quad \text{(Eq. 11)}$$

The values of $A_j$ depend, obviously, on the coil geometry.

This modification is, again, disadvantageous in terms of signal-to-noise ratio but can be helpful to obtain an image $I_{hom}$ with even more uniform sensitivity.

The effectiveness of the invention is illustrated with images of a simulated case.

Figure 4A:
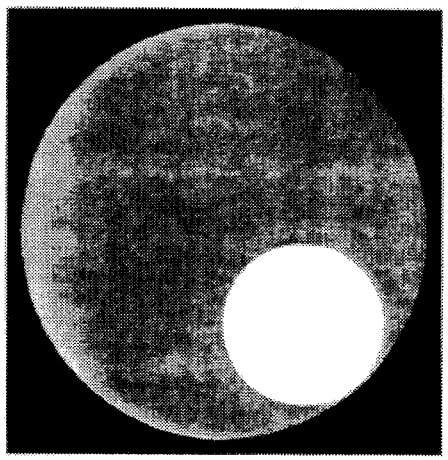
FIGS. 4a–4e shows an ideal image and the results obtained with four separate surface coils.
Figure 4B:
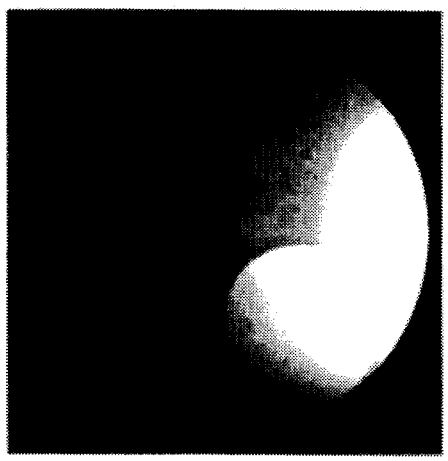
Figure 4C:
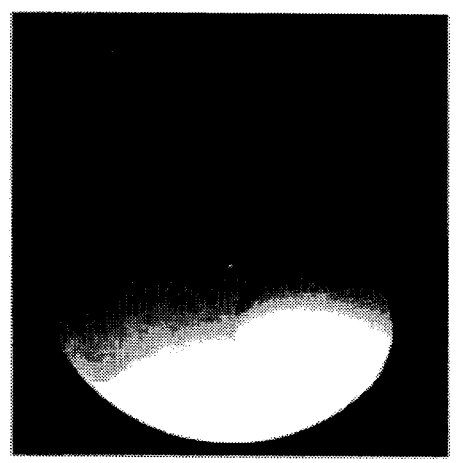
Figure 4D:
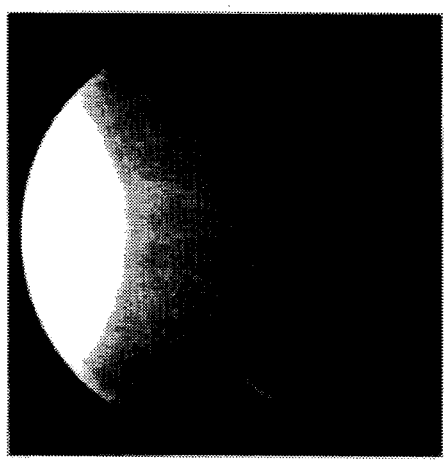
Figure 4E:
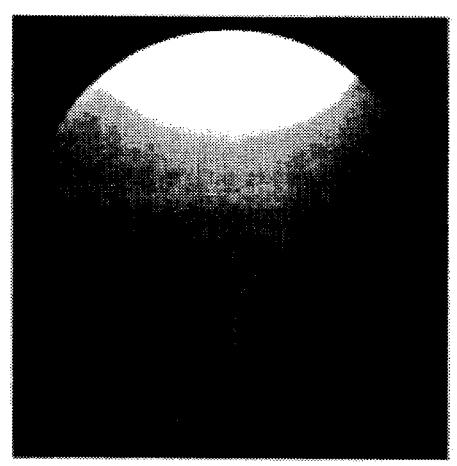

FIG. 4a represents the actual spin density. This would be the perfect image. FIG. 4b–4e represent the images obtained with four surface coils at different locations. Clearly, the images of the separate surface coils are very inhomogeneous.

Figure 5A:
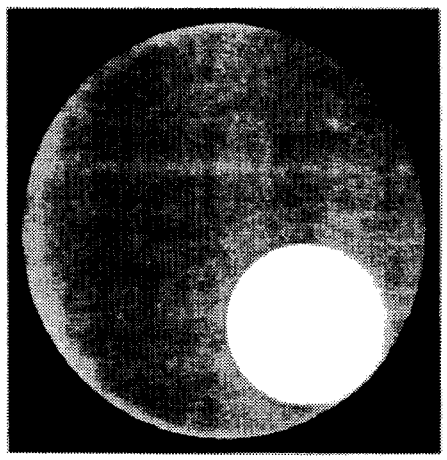
FIGS. 5a–5f shows again the ideal image, $I_{SNR}$ and two end-results obtained with two versions of $I_{hom}$.
Figure 5B:
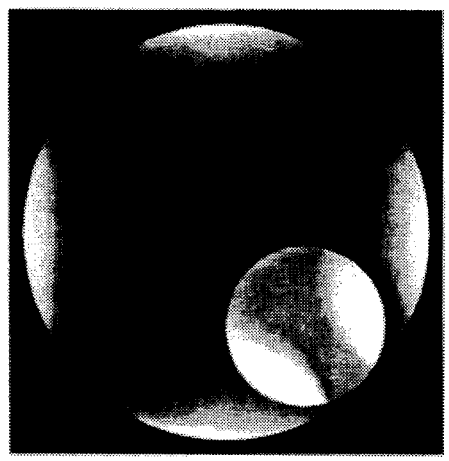

FIG. 5a represents again the ideal image and FIG. 5b is $I_{SNR}$.

Figure 5C:
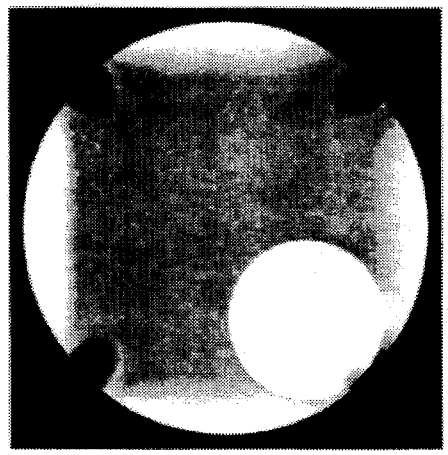
Figure 5D:
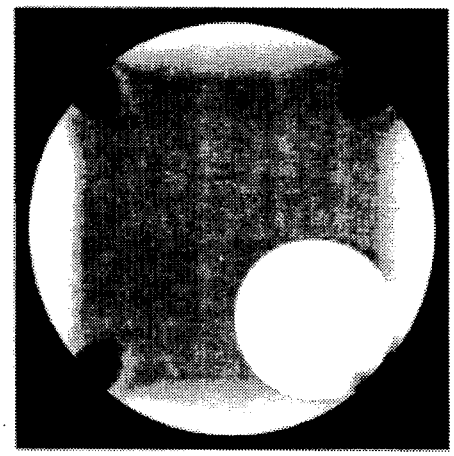
Figure 5E:
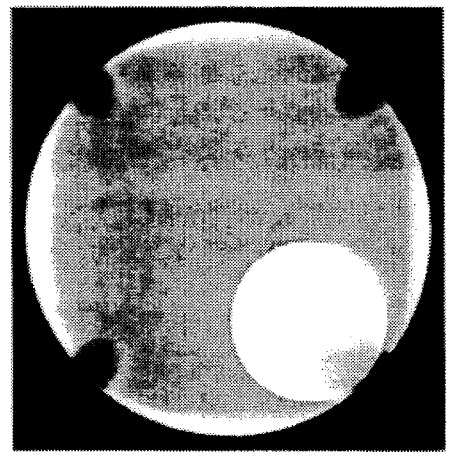

FIG. 5c and 5e are two versions of $I_{hom}$ ($\alpha=1$ and $\alpha=0.5$ respectively).

Figure 5F:
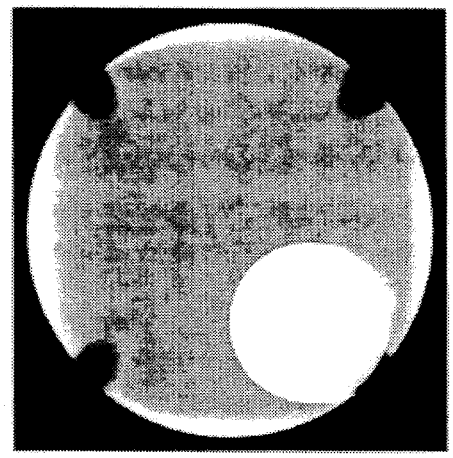

FIG. 5d and 5f represent the corresponding results, i.e. the combination of $I_{SNR}$ with $I_{hom}$ ($\alpha=1$) and with $I_{hom}$ ($\alpha=0.5$) respectivily.

We claim:

1. A method of determining a magnetic resonance (MR) distribution in a part of a body using an arrangement of multiple surface coils, comprising determining separate component distributions from magnetic resonance signals obtained by means of separate ones of said surface coils, combining said component distributions to form a distribution $I_{hom}$ which is optimized with respect to homogeneity and a distribution $I_{SNR}$ which is optimized with respect to signal-to-noise ratio, and combining said distributions $I_{hom}$ and $I_{SNR}$ to form said MR distribution.

2. A method as claimed in claim 1, wherein a ratio of the distributions $I_{hom}$ and $I_{SNR}$ is determined and used to correct the homogeneity of the distribution $I_{SNR}$, the corrected distribution $I_{SNR}$ forming said MR distribution.

3. A method as claimed in claim 2, wherein the distribution $I_{SNR}$ equals the square root of the sum of the squares of the absolute values of said component distributions.

4. A method as claimed in claim 2, wherein the distribution $I_{hom}$ equals the $\alpha$ root of the sum of the $\alpha$ powers of the absolute values of said component distributions with $\alpha$ being a positive number $\leq 1.5$.

5. A method as claimed in claim 2, wherein the distribution $I_{hom}$ equals the absolute value of the sum of the complex values of said component distributions.

6. A method as claimed in claim 2, wherein the combining of said component distributions to form the distribution $I_{hom}$ includes multiplication of each component distribution with a weight factor.

7. A method as claimed in claim 1, wherein the distributions $I_{hom}$ and $I_{SNR}$ are smoothed and the ratio of the smoothed distribution $I_{hom}$ and the smoothed distribution $I_{SNR}$ is determined and used to correct the homogeneity of the distribution $I_{SNR}$, the corrected distribution $I_{SNR}$ forming said MR distribution.

8. A method as claimed in claim 7, wherein the distribution $I_{SNR}$ equals the square root of the sum of the squares of the absolute values of said component distributions.

9. A method as claimed in claim 7, wherein the distribution $I_{hom}$ equals the $\alpha$ root of the sum of the $\alpha$ powers of the absolute values of said component distributions with $\alpha$ being a positive number $\leq 1.5$.

10. A method as claimed in claim 7, wherein the distribution $I_{hom}$ equals the absolute value of the sum of the complex values of said component distributions.

11. A method as claimed in claim 7, wherein the combining of said component distributions to form the distribution $I_{hom}$ includes multiplication of each component distribution with a weight factor.

12. A method as claimed in claim 1, wherein the ratio of the distribution $I_{hom}$ and $I_{SNR}$ is determined, said ratio is smoothed and said smoothed ratio is used to correct the homogeneity of the distribution $I_{SNR}$, the corrected distribution $I_{SNR}$ forming said MR distribution.

13. A method as claimed in claim 12, wherein the distribution $I_{SNR}$ equals the square root of the sum of the squares of the absolute values of said component distributions.

14. A method as claimed in claim 12, wherein the distribution $I_{hom}$ equals the $\alpha$ root of the sum of the $\alpha$ powers of the absolute values of said component distributions with $\alpha$ being a positive number $\leq 1.5$.

15. A method as claimed in claim 12, wherein the distribution $I_{hom}$ equals the absolute value of the sum of the complex values of said component distributions.

16. A method as claimed in claim 12, wherein the combining of said component distributions to form the distribution $I_{hom}$ includes multiplication of each component distribution with a weight factor.

17. A method as claimed in claim 1, wherein the distribution $I_{SNR}$ equals the square root of the sum of the squares of the absolute values of said component distributions.

18. A method as claimed in claim 1, wherein the distribution $I_{hom}$ equals the $\alpha$ root of the sum of the $\alpha$ powers of the absolute values of said component distributions with $\alpha$ being a positive number $\leq 1.5$.

19. A method as claimed in claim 1, wherein the distribution $I_{hom}$ equals the absolute value of the sum of the complex values of said component distributions.

20. A method as claimed in claim 1, wherein the combining of said component distributions to form the distribution $I_{hom}$ includes multiplication of each component distribution with a weight factor.

21. A magnetic resonance (MR) imaging apparatus for determining a MR distribution in a part of a body, comprising input terminals for an arrangement of multiple surface coils, means to determine component distributions using separate surface coils of said arrangement, means to combine said component distributions to form a distribution $I_{hom}$ which is optimized with respect to homogeneity, means to combine said component distributions to form a distribution $I_{SNR}$ which is optimized with respect to signal-to-noise ratio, and means to combine said distributions $I_{hom}$ and $I_{SNR}$ to form said MR distribution.

* * * * *